United States Patent
Raad

Patent Number: 6,038,159
Date of Patent: Mar. 14, 2000

[54] MEMORY ARCHITECTURE AND DECODER ADDRESSING

[75] Inventor: George B. Raad, Boise, Id.

[73] Assignee: Micron Technology, Inc., Boise, Id.

[21] Appl. No.: 09/252,369

[22] Filed: Feb. 18, 1999

Related U.S. Application Data

[63] Continuation of application No. 08/874,241, Jun. 13, 1997, Pat. No. 5,892,703.

[51] Int. Cl.[7] ........................................... G11C 5/02
[52] U.S. Cl. ........................................ 365/51; 365/230.06
[58] Field of Search ............................... 365/51, 230.08, 365/230.06, 189.05, 230.01, 230.03

[56] References Cited

U.S. PATENT DOCUMENTS

| | | | |
|---|---|---|---|
| 4,748,591 | 5/1988 | Itoh et al. | 365/51 |
| 5,400,283 | 3/1995 | Raad | 365/203 |
| 5,526,318 | 6/1996 | Slemmer et al. | 365/226 |
| 5,574,698 | 11/1996 | Raad | 365/230.06 |
| 5,586,080 | 12/1996 | Raad et al. | 365/230.06 |
| 5,706,244 | 1/1998 | Shimizu | 365/230.03 |
| 5,717,629 | 2/1998 | Yin | 365/149 |
| 5,892,703 | 4/1999 | Raad | 365/51 |

*Primary Examiner*—Trong Phan
*Assistant Examiner*—Thong Le
*Attorney, Agent, or Firm*—Schwegman, Lundberg, Woessner & Kluth, P.A.

[57] ABSTRACT

A memory architecture includes a matrixed arrangement of memory cell arrays having interstitial separations bounding each memory cell array. The interstitial separations between memory cell arrays include longitudinal streets, carrying row decoders, and latitudinal streets, carrying column decoders that include sense amplifiers. Decoder control circuits are disposed in the intersections of the longitudinal and latitudinal streets. Each decoder control circuit includes drivers for providing addressing or other signals to pairs of adjacent row or column decoders. Each driver provides a signal to more than one decoder, such as to each of the row or column decoders between which the decoder control circuit is interposed. The decoder control circuit requires fewer drivers, which can be staggered or laterally offset to better accommodate magnitude reductions of the interstitial separations between memory cell arrays, thereby increasing storage density.

20 Claims, 7 Drawing Sheets

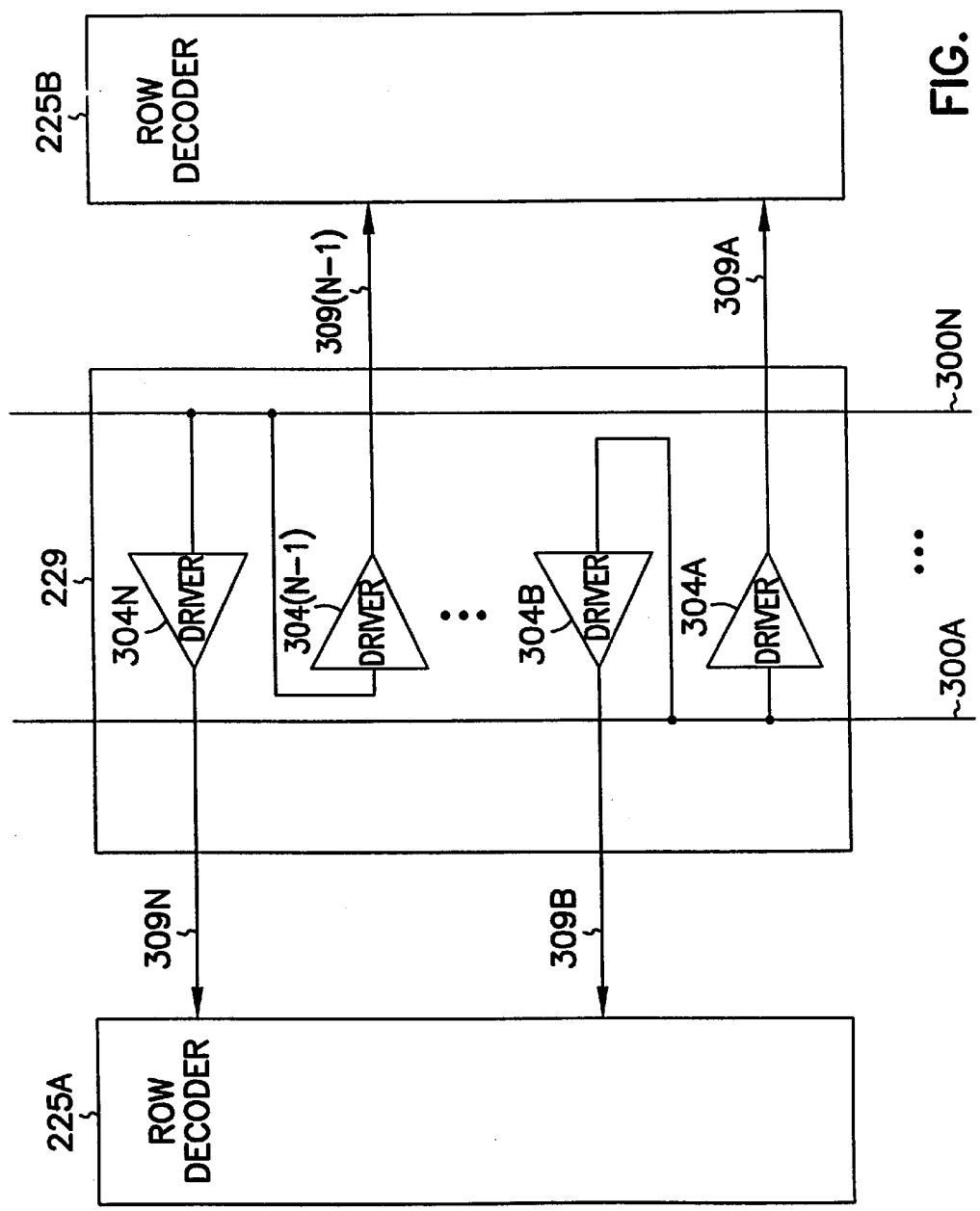

MEMORY ARCHITECTURE AND DECODER ADDRESSING

This application is a continuation of U.S. Ser. No. 08/874,241, filed Jun. 13, 1997 now U.S. Pat. No. 5,892,703.

TECHNICAL FIELD OF THE INVENTION

This invention relates generally to integrated circuit memory architectures and more particularly to addressing of decoders contained therein.

BACKGROUND OF THE INVENTION

Integrated circuit memories that are used for electronic data storage include dynamic random access memories (DRAMs), static random access memories (SRAMs), electrically erasable and programmable read only memories (EEPROMs), synchronous random access memories or other types of memories that include a matrix of selectively addressable memory cells.

For example, FIG. 1 is a floorplan block diagram that illustrates the architecture of a conventional DRAM 100, which typically includes a matrixed arrangement of multiple memory cell arrays 105, each of which is understood to contain a matrixed arrangement of memory cells. The interstitial separations between the memory cell arrays 105 carry support circuits for addressing the memory cells in the memory cell arrays 105, such as for performing reading and writing operations. The interstitial separations include longitudinal streets 110 and latitudinal streets 115.

Longitudinal streets 110 typically include column decoder and sense amplifier circuits, which together are adjacent to or interposed between ones of memory cell arrays 105. The column decoder and sense amplifier circuits are used for reading data from and writing data to selected digit lines, which are in the memory cell arrays 105 and are coupled to memory cells therein. Latitudinal streets 115 typically include row decoders that are adjacent to or interposed between ones of memory cell arrays 105. The row decoder circuits are used for selectively activating word lines in a memory cell array 105 for accessing memory cells therein.

The column decoder and sense amplifier circuits in the longitudinal streets 110 and the row decoder circuits in the latitudinal streets 115 are sometimes referred to collectively as "pitch cell" circuits, because such circuits are laid out on the same pitch (spacing between adjacent ones) of the digit lines and word lines to which they are respectively coupled. The interstitial separations between memory cell arrays 105 occupy a considerable portion of the integrated circuit DRAM. In order to improve storage density, for reducing the component size of integrated circuit DRAM 100 or for increasing the data storage capability of integrated circuit DRAM 100, the magnitude of the interstitial separations between memory cell arrays 105 should be decreased, such as by electrical circuit design or physical layout design techniques. For example, it is known in the art to provide an output driver in a row decoder that is interposed between two memory cell arrays 105, where an output node of the output driver provides an output signal to a word line in each of the memory cell arrays 105 between which the row decoder is interposed. This reduces the size of the row decoder and the magnitude of the interstitial separations between memory cell arrays.

However, even if such design techniques are successful, there is a need in the art to provide, in a spatially efficient manner, control signals (e.g., addressing signals) to the row decoders in the latitudinal streets 115 and to the column decoders in the longitudinal streets 110. Thus, in order to fully realize the gains in storage density arising from reducing the magnitude of the interstitial separations between memory cell arrays 105, there is a need in the art to accommodate such magnitude reductions when providing signals to the pitch cells carried within the interstitial separations.

SUMMARY OF THE INVENTION

The present invention allows better utilization of the gains in storage density realized by reducing the magnitude of the interstitial separations between memory cell arrays in an integrated circuit memory. According to one aspect of the invention, such magnitude reductions are accommodated when providing signals to the pitch cells carried within the interstitial separations. In one embodiment, the invention provides an integrated circuit memory having a plurality of memory cell arrays arranged in a grid pattern. Adjacent ones of the memory cell arrays are laterally separated, thereby defining longitudinal streets. Adjacent ones of the memory arrays are vertically separated, thereby defining latitudinal streets. Gap regions are defined by intersections of the longitudinal and latitudinal streets. First and second decoders are located in the latitudinal streets and separated by the gap region. A decoder control circuit is located in the gap region and coupled to provide an output signal to the first and second decoders.

In another embodiment, the invention provides an integrated circuit memory having a plurality of memory cell arrays arranged in a grid pattern. Adjacent ones of the memory cell arrays are laterally separated, thereby defining longitudinal streets. Adjacent ones of the memory arrays are vertically separated, thereby defining latitudinal streets. A gap region is defined by an intersection of the longitudinal and latitudinal streets. A pair of row decoders is provided. The pair of row decoders is located in a latitudinal street. A first row decoder in the pair has X/2 inputs and is located on a first side of the gap region. A second row decoder in the pair has X/2 inputs and is located on an opposite side of the gap region. Together, the first and second row decoders have X inputs. A decoder control circuit is located in the gap region. The decoder control circuit provides X/2 output signals (e.g., shared pairwise) to the X inputs of the first and second row decoders.

In another embodiment, the invention provides an integrated circuit memory having a plurality of memory cell arrays. The memory cell arrays are arranged in a matrix with longitudinal and latitudinal streets bounding the memory cell arrays. A plurality of row decoders are placed in (and define a magnitude of) the latitudinal streets. Each row decoder is coupled to at least one of the memory cell arrays by a plurality of word lines. A plurality of sense amplifiers is placed in the longitudinal streets. Each sense amplifier is coupled to at least one of the memory cell arrays by at least one digit line pair. A plurality of column decoders is placed in the longitudinal streets and, together with the sense amplifiers, define a magnitude thereof. Each column decoder is coupled to at least one of the memory cell arrays by a plurality of digit lines. A plurality of decoder control circuits are included. Each decoder control circuit is placed in an intersection of one of the longitudinal streets and one of the latitudinal streets. Each decoder control circuit carries a plurality of drivers. Ones of the plurality of drivers are coupled to more than one row decoder for providing an address signal to the more than one row decoder.

BRIEF DESCRIPTION OF THE DRAWINGS

In the drawings, like numerals describe substantially similar components throughout the several views.

FIG. 3A is a schematic/floorplan diagram that illustrates generally a portion of a typical decoder control circuit.

DETAILED DESCRIPTION OF THE INVENTION

In the following detailed description, reference is made to the accompanying drawings which form a part hereof, and in which is shown by way of illustration specific embodiments in which the invention may be practiced. These embodiments are described in sufficient detail to enable those skilled in the art to practice the invention, and it is to be understood that the embodiments may be combined, or that other embodiments may be utilized and that structural, logical and electrical changes may be made without departing from the scope of the present invention. The following detailed description is, therefore, not to be taken in a limiting sense, and the scope of the present invention is defined by the appended claims and their equivalents.

Figure 1:
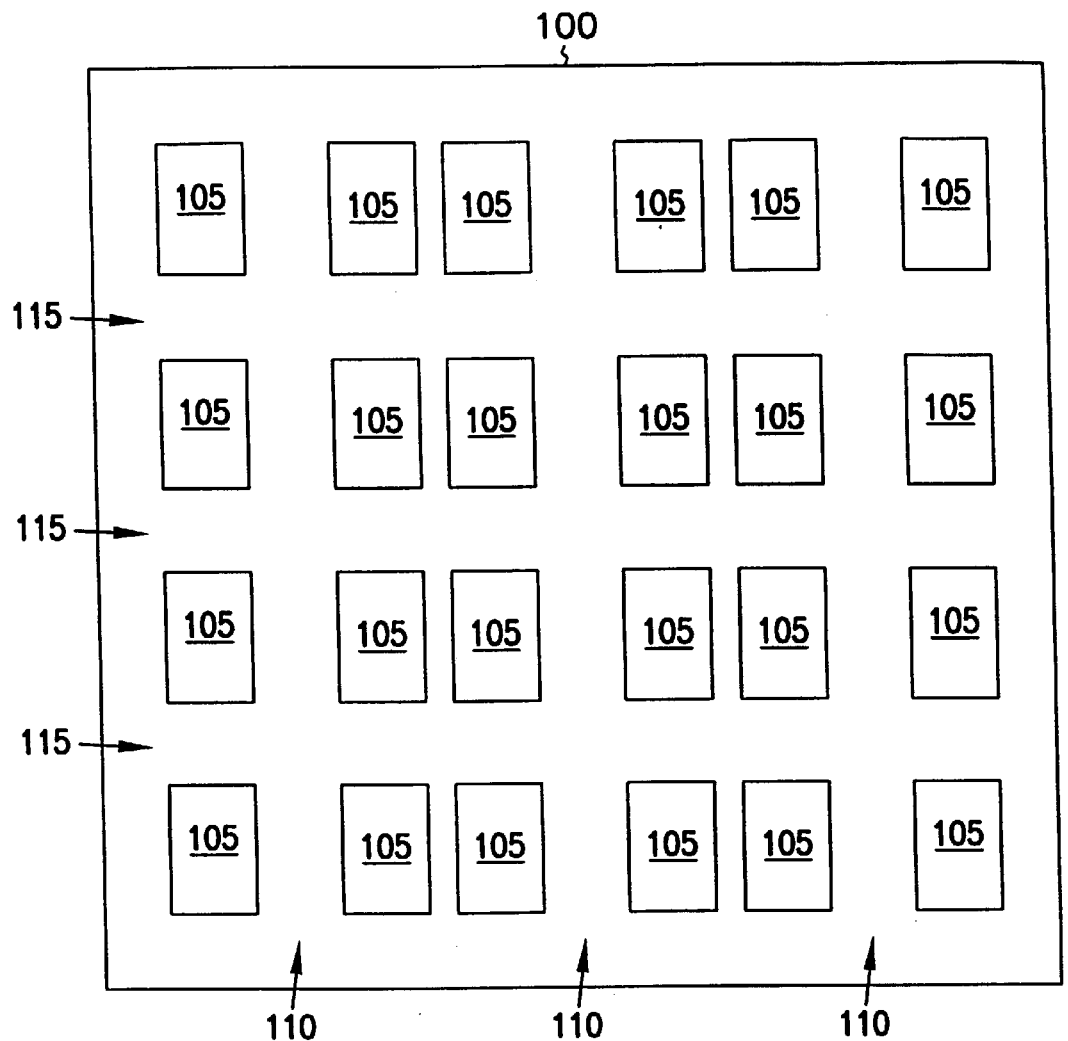
FIG. 1 is a floorplan block diagram that illustrates the architecture of a conventional dynamic random access memory (DRAM).
Figure 2:
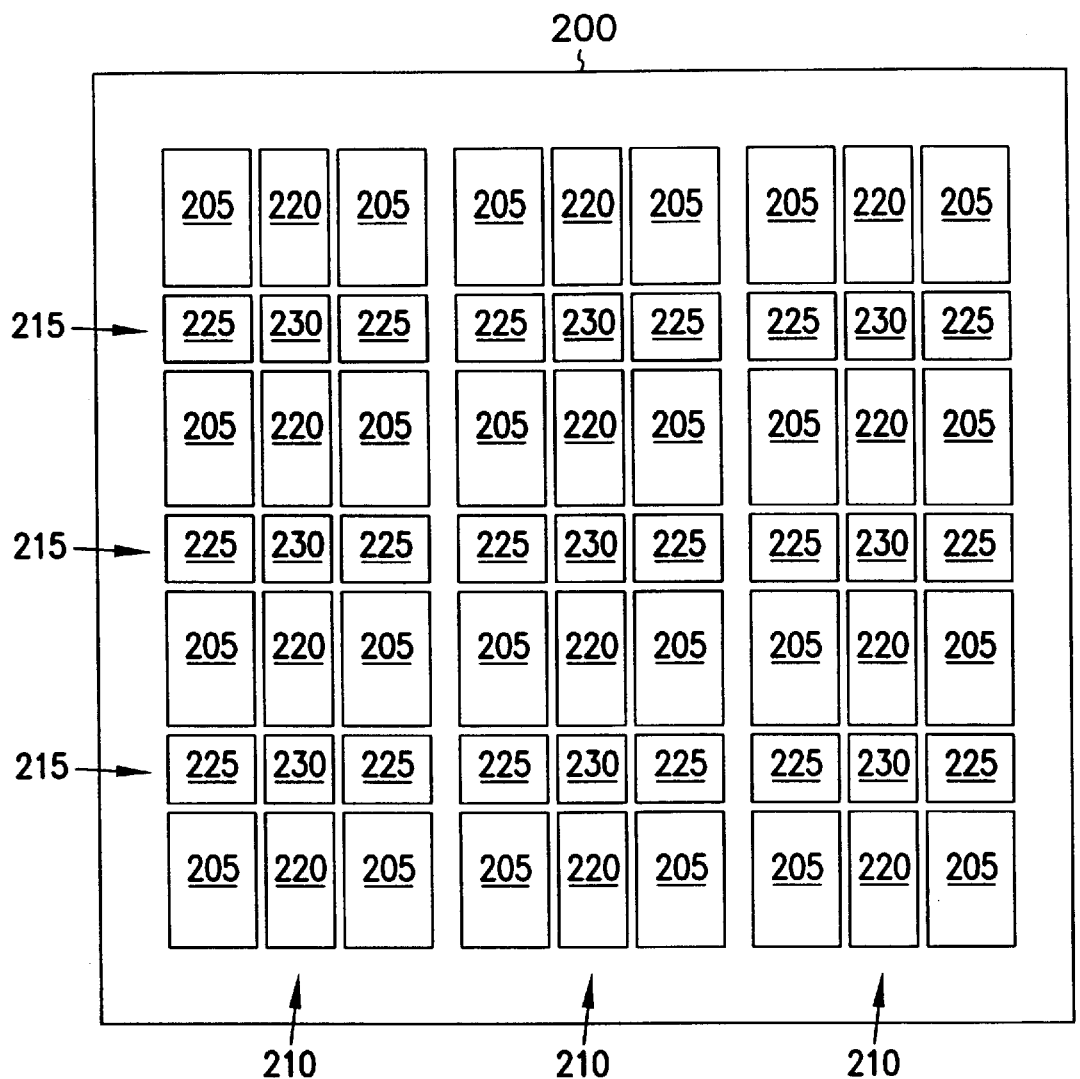
FIG. 2 is a floorplan block diagram that illustrates generally the architecture of one embodiment of a memory according to the teachings of the present invention.

The memory architecture of the present invention provides signals to circuits disposed in interstitial separations between memory cell arrays, while accommodating the reductions in the magnitude of such separations that are needed for improving storage densities. FIG. 2 is a floorplan block diagram that illustrates generally the architecture of one embodiment of a memory 200, such as a dynamic random access memory (DRAM) or other memory, according to the teachings of the present invention. Memory 200 typically includes a matrixed grid arrangement of multiple memory cell arrays 205, each of which is understood to contain a matrixed grid arrangement of memory cells. Each memory cell comprises a storage capacitor for storing a data bit as a charge and an access transistor for accessing the charge.

The interstitial separations between the memory cell arrays 205 include support circuits for addressing the memory cells in the memory cell arrays 205, such as for performing reading and writing operations. The interstitial separations include longitudinal streets 210 and latitudinal streets 215. Longitudinal streets 210 are defined by lateral separations between adjacent memory cell arrays 205. Latitudinal streets 215 are defined by vertical separations between adjacent memory cell arrays 205. Longitudinal streets 210 typically include column decoders 220, which typically also include sense amplifier circuits. Column decoders 220 are adjacent to or interposed between ones of memory cell arrays 205. Column decoders 220 are used for reading data from and writing data to selected digit lines in one or more adjacent memory cell arrays 205 and coupled to memory cells therein. Latitudinal streets 215 typically include row decoders 225 that are adjacent to or interposed between ones of memory cell arrays 205. The row decoders 225 are used for selectively activating word lines in one or more adjacent memory cell arrays 205 for accessing memory cells therein. Decoder control circuits 230 are disposed in gap regions defined by the intersections of longitudinal streets 210 and latitudinal streets 215 for providing signals, such addressing or other control signals, to ones of the row decoders 225 or to ones of column decoders 220 (including providing control signals to sense amplifiers in the column decoders 220).

The column decoders 220 in longitudinal streets 210 and the row decoders 225 in latitudinal streets 215 are sometimes referred to collectively as "pitch cell" circuits, as described above. Shrinking the size of column decoders 220 and row decoders 225 reduces the magnitude of the interstitial separations between memory cell arrays 205, thereby increasing storage density. However, decoder control circuits 230 must also be designed to accommodate the reduced-magnitude interstitial separations, since they are disposed in the intersections of longitudinal streets 210 and latitudinal streets 215.

As described in detail below, one embodiment of the present invention provides a matrixed arrangement of memory cell arrays 205, a number of gap regions defined by the intersections of longitudinal streets 210 and latitudinal streets 215. Also provided are pairs of decoders, such as row decoders 225, each pair of row decoders 225 located in a latitudinal street. A first row decoder in the pair is located on a first side of a gap region, and a second row decoder in the pair is located on an opposite side of the gap region. Decoder control circuits 230 are provided, each located in a gap region defined by the intersections of longitudinal streets 210 and latitudinal streets 215. The decoder control circuit 230 provides output signals to one of the pairs of row decoders 225.

FIG. 3A is a schematic/floorplan diagram that illustrates generally a portion of a typical decoder control circuit 229, interposed between a pair of decoder circuits such as first and second row decoder circuits 225A–B to which it provides signals. Decoder control circuit 229 receives input signals, such as decoder addressing signals, at input nodes 300A–N, such as via interconnection lines carried in the interstitial separations, e.g. in longitudinal streets 210 or latitudinal streets 215. Decoder control circuit 229 includes drivers 304A–N, each receiving one of the input signals at input nodes 300A–N, and providing, in response thereto, a resulting output signal at one of output nodes 309A–N to one of row decoders 225A or 225B. Thus, decoder control circuit 229 uses X individual drivers 304A–N to individually provide a total of X output signals to X inputs of row decoders 225A–B, which include the X/2 inputs of row decoder 225A and the X/2 inputs of row decoder 225B.

Figure 3B:
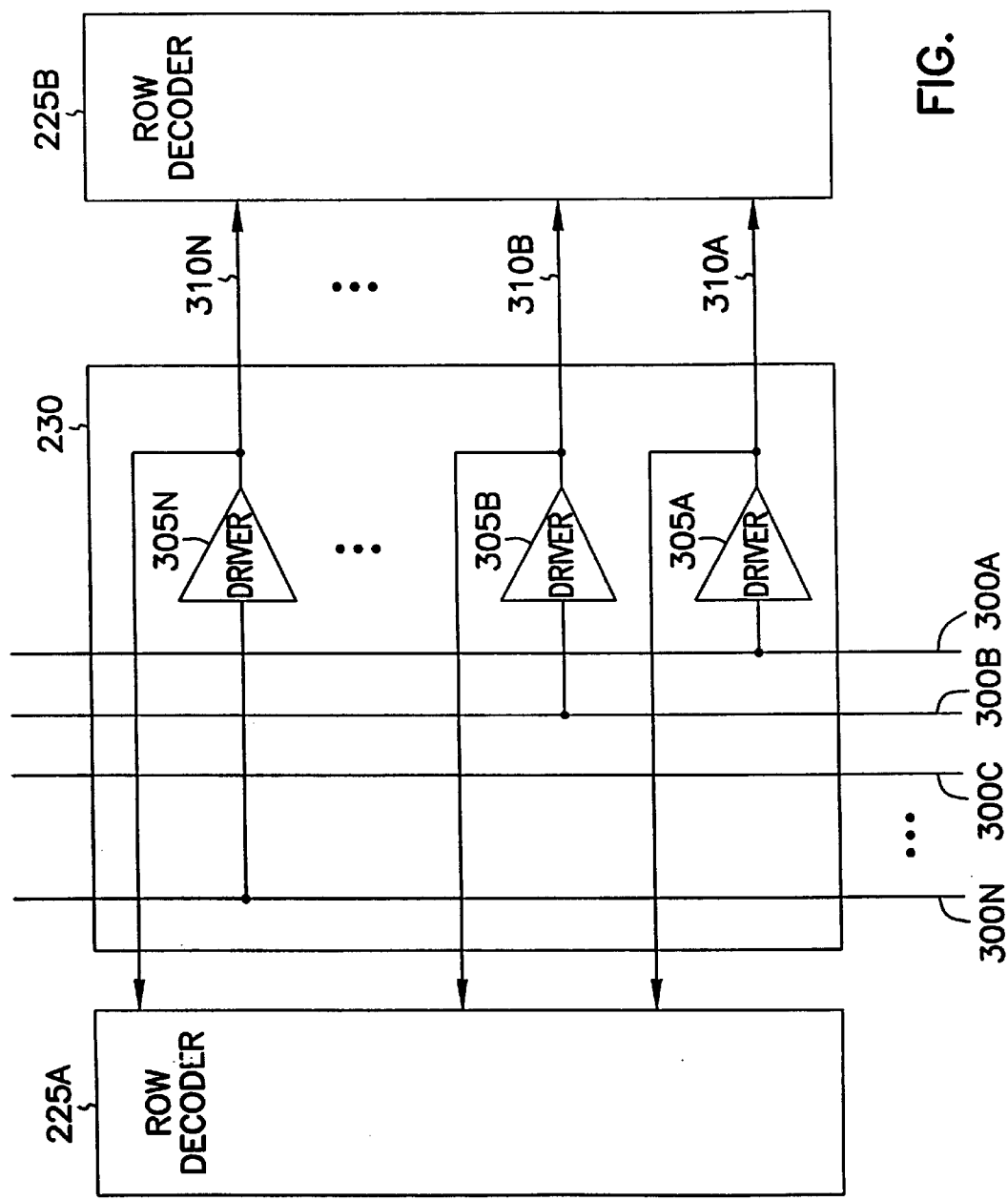
FIG. 3B is a schematic/floorplan diagram that illustrates generally a portion of one embodiment of a decoder control circuit according to the teachings of the present invention.

FIG. 3B is a schematic/floorplan diagram that illustrates generally a portion of one embodiment of decoder control circuit 230, according to the teachings of the present invention, interposed between a pair of decoder circuits such as first and second row decoder circuits 225A–B to which it provides signals. Decoder control circuit 230 receives input signals, such as decoder addressing signals, at input nodes 300A–N, such as via interconnection lines carried in the interstitial separations, e.g. in longitudinal streets 210 or latitudinal streets 215. Decoder control circuit 230 includes drivers 305A–N, each receiving one of the input signals at input nodes 300A–N, and providing, in response thereto, a resulting output signal at one of output nodes 310A–N to both of row decoders 225A and 225B.

Decoder control circuit 230 uses shared drivers 305A–N, each of which provides signals in opposite directions to row decoders 225A–B located on opposite sides of the gap region in which the decoder control circuit 230 is disposed, rather than using separate ones of drivers 305A–N for individually providing resulting output signals to each of row decoders 225A and 225B. For example, in one embodiment, a polysilicon feedthrough interconnection can be used to route the signal at one of the output nodes 310A–N to one or more of row decoders 225A and 225B. Thus, decoder control circuit 230 uses X/2 shared drivers 305A–N to provide a total of X/2 output signals to the X inputs of row decoders 225A–B. The X/2 output signals provided by decoder control circuit 230 are shared between the X/2 inputs of row decoder 225A and the X/2 inputs of row decoder 225B. Since fewer drivers are used in decoder control circuit 230 than in decoder control circuit 229, the vertical dimension of decoder control circuit 230 can be less than that of decoder control circuit 229. As a result, decoder control circuit 230 more easily accommodates magnitude reductions of the interstitial separations between memory cells 105, thereby improving memory storage density.

In one embodiment, the input signals at input nodes 300A–N include addressing signals, for which resulting output signals are provided at nodes 310A–N to row decoders 225A–B for addressing particular word lines in one or more memory cell arrays 205 that are adjacent to the row decoders 225A–B. However, the input signals could also include other control signals for which corresponding resulting signals are provided to row decoders 225A–B. Embodiments of drivers 305A–N include inverters, buffers, logic circuits, latches, flip-flops, or other circuits having sufficient transconductance capabilities to drive output nodes 310A–N and the corresponding capacitive loads in each of row decoders 225A and 225B.

Figure 4:
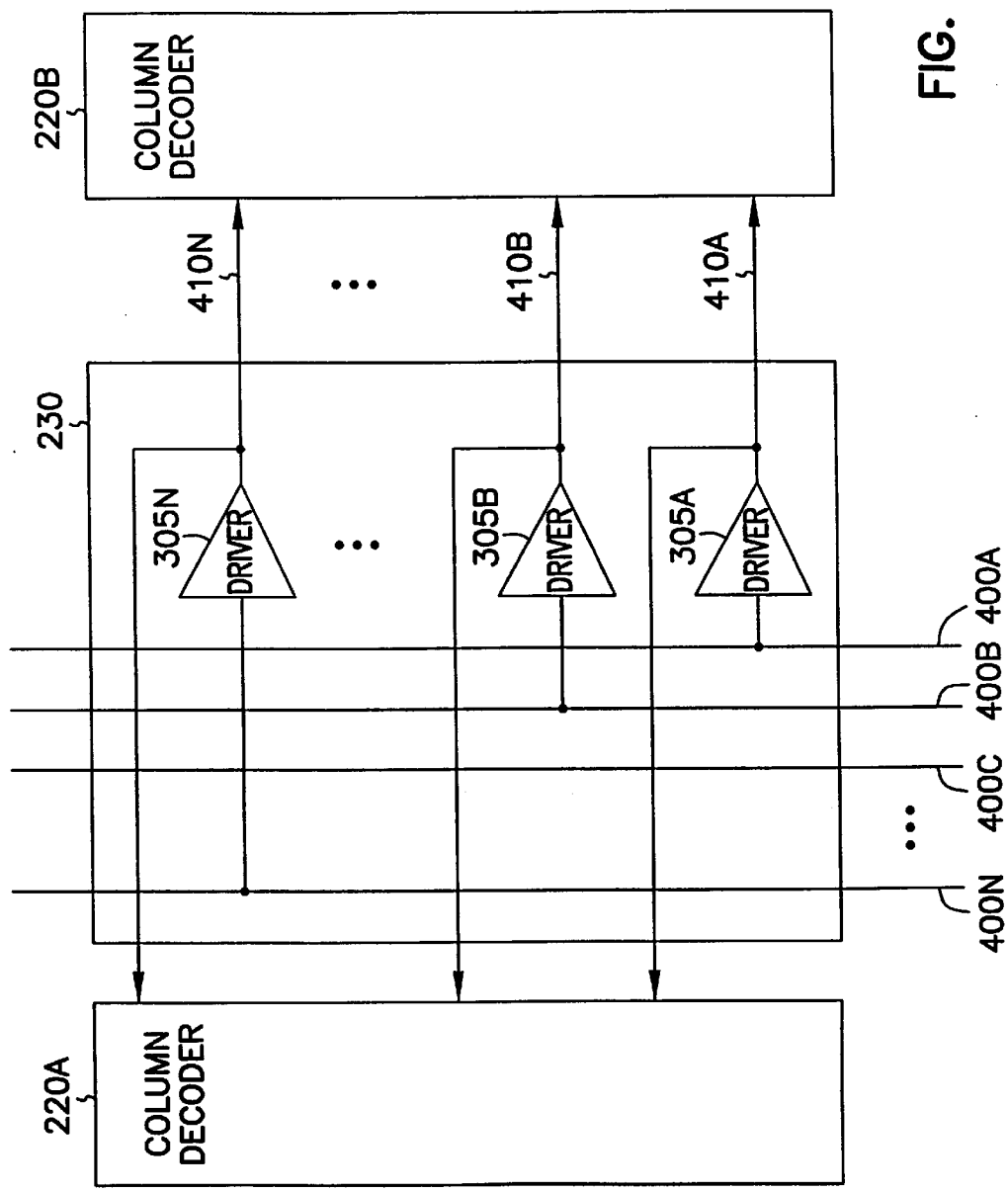
FIG. 4 is a schematic/floorplan diagram that illustrates generally a portion of one embodiment of decoder control circuit according to the teachings of the present invention, rotated from the illustration of FIG. 3B.

FIG. 4 is a schematic/floorplan diagram that illustrates generally a portion of one embodiment of decoder control circuit 230, according to the teachings of the present invention, rotated from the view shown by the illustration of FIG. 3B, i.e. having decoder control circuit 230 interposed between column decoder circuits 220A–B to which it provides signals. In this embodiment, decoder control circuit 230 receives input signals at input nodes 400A–N, such as via interconnection lines carried in interstitial separations, e.g. in longitudinal streets 210 or latitudinal streets 215.

Decoder control circuit 230 includes drivers 305A–N, each receiving one of the input signals at input nodes 400A–N, and providing, in response thereto, a resulting output signal at one of output nodes 410A–N to both of column decoders 220A and 220B, rather than using separate ones of drivers 305A–N for individually providing resulting output signals to each of column decoders 220A and 220B. In one embodiment, the output signals that are provided to column decoders 220A–B are addressing signals for controlling the accessing of particular digit lines in one or more adjacent memory cell arrays 205. In another embodiment, the output signals that are provided to column decoders 220A–B include control signals for sense amplifiers contained therein. It is understood that the embodiments of FIGS. 3B and 4 could also be combined, such as to provide signals to pairs of row decoders 225 and pairs of column decoders 220, each of which the decoder control circuit 230 is interposed between.

Figure 5:
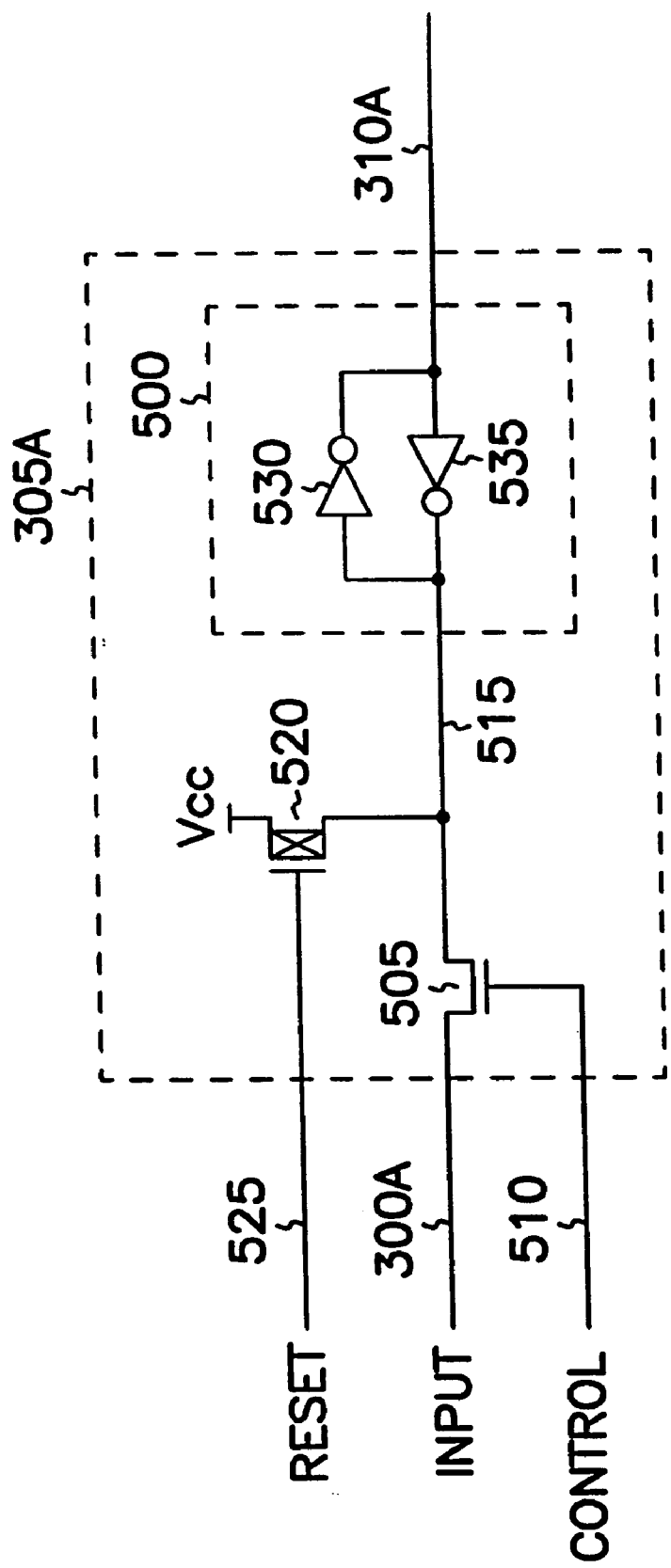
FIG. 5 is a schematic diagram that illustrates generally, by way of example, one embodiment of a driver circuit according to the teachings of the present invention.

FIG. 5 is a schematic diagram that illustrates generally, by way of example, one embodiment of a driver 305 such as driver 305A, as described with respect to FIG. 3B. In FIG. 5, driver 305A includes latch 500 coupled to input node 300A, such as through n-channel field-effect transistor (NFET) pass switch 505, for receiving an input signal, and providing an output signal at node 310A in response thereto. Pass switch 505 also receives control signal at node 510 for coupling/isolating the input signal at node 300A from the input node 515 of latch 500. Driver 305A also includes a reset switch 520, such as a p-channel field-effect transistor (PFET), which is controlled by a reset signal received at node 525, for coupling/isolating the input node 515 of latch 500 to and from an appropriate voltage level, such as a positive power supply voltage $V_{CC}$. Latch 500 includes back-to-back inverters 530 and 535. Feedforward inverter 530 provides the output signal at node 310A, e.g. to capacitive loads in each of row decoders 225A and 225B, and the pullup and pulldown transistors therein must therefore be scaled appropriately to provide sufficient transconductance capability for this purpose.

Figure 6:
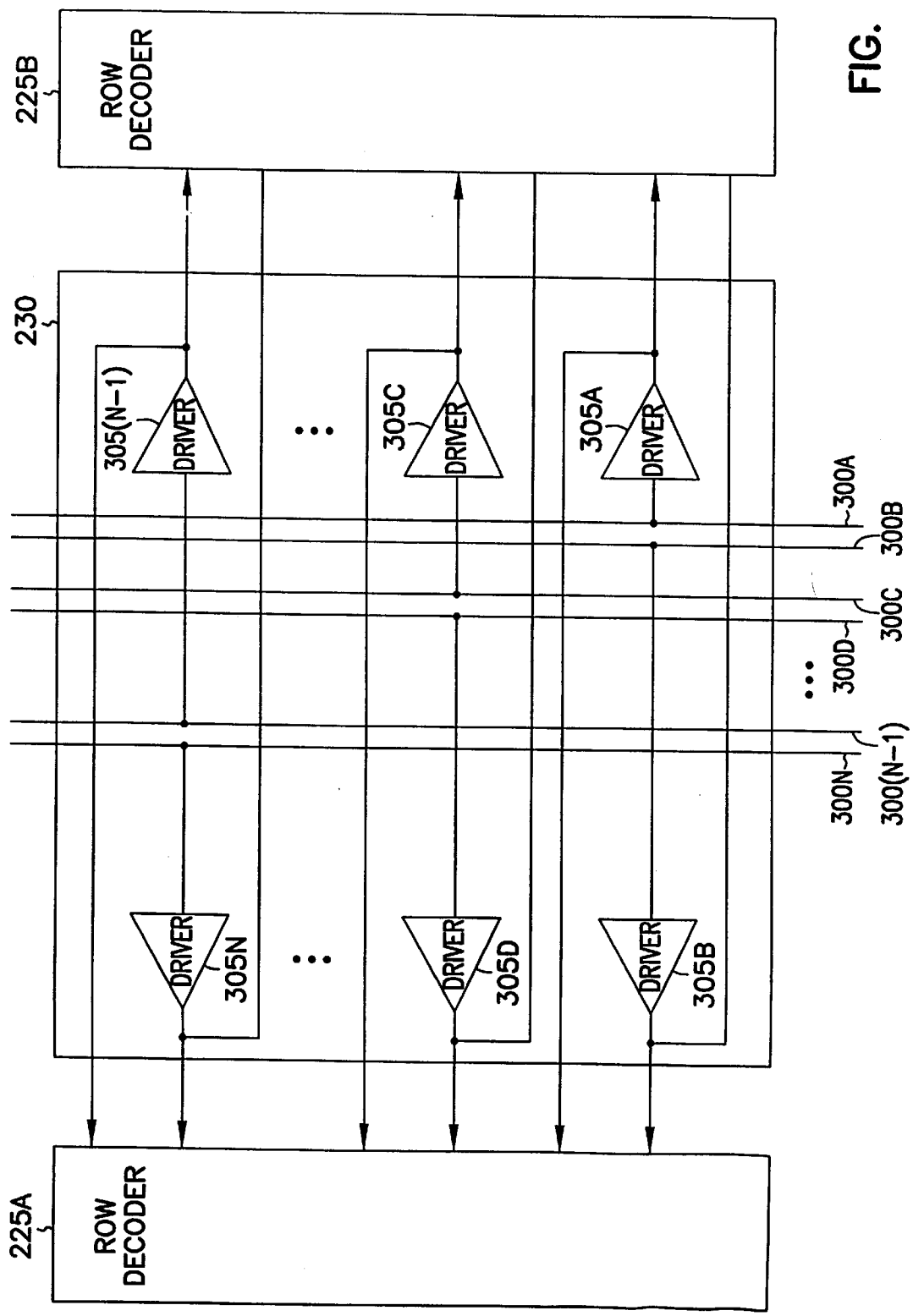
FIG. 6 is a schematic/floorplan diagram, similar to the schematic diagram of FIG. 3B, that illustrates generally a further embodiment of the present invention.

FIG. 6 is a schematic/floorplan diagram, similar to the schematic diagram of FIG. 3B, that illustrates generally a further embodiment of the present invention. In FIG. 6, drivers 305A–N are configured in a staggered arrangement, in which the drivers are arranged in pairs (e.g., 305A–B). Each driver 305 in the pair is laterally offset from the other driver 305 in the pair, in order to better accommodate any reduction of the height of the latitudinal streets 215 between memory cell arrays 205. In FIG. 6, the lateral offset is illustrated by approximately vertically aligned drivers 305 in each pair of drivers, but it is understood that the drivers 305 in each pair need not be exactly vertically aligned. The drivers 305 in each pair may be vertically offset as well as laterally offset in accordance with one aspect of the present invention. It is also understood that the pairwise arrangement of drivers 305 in FIG. 6 could be analogously applied to the schematic diagram of FIG. 4 to provide signals to column decoders 220 rather than row decoders 225.

By using a single shared driver 305 to provide an output signal to each one of a pair of row decoders 225 or a pair of column decoders 220, the decoder control circuit 230 can be physically implemented in less space than if a first driver was used to provide an output signal to a first row or column decoder and a second driver was used to provide an output signal to a second row or column decoder. Thus, the memory architecture of the present invention better accommodates the magnitude reductions of the longitudinal streets 210 or latitudinal streets 215. One aspect of the present invention is that the sharing of drivers described above allows decoder control circuit 230 to avoid limiting the magnitude of the interstitial separations between memory cell arrays 205. The magnitude of the interstitial separations is limited only by the pitch cells, i.e. row decoders 225 and column decoders 220. Thus, the magnitude reductions of the interstitial separations, together with the corresponding size reduction of decoder control circuit 230, increase the memory storage density.

It is to be understood that the above description is intended to be illustrative, and not restrictive. Many other embodiments will be apparent to those of skill in the art upon reviewing the above description. The scope of the invention should, therefore, be determined with reference to the appended claims, along with the full scope of equivalents to which such claims are entitled.

What is claimed is:

1. An integrated circuit memory, comprising:

first and second decoders separated by a first gap region; and a decoder control circuit located in the first gap region, the decoder control circuit including a driver that is coupled to provide at least one output signal to each of the first and second decoders.

2. The memory of claim 1, in which the first and second decoders are row decoders.

3. The memory of claim 1, in which the first and second decoders are located in latitudinal streets.

4. The memory of claim 1, in which the first and second decoders are column decoders.

5. The memory of claim 1, in which the first and second decoders are located in longitudinal streets.

6. The memory of claim 1, in which the driver includes an inverter.

7. The memory of claim 1, in which the driver includes a latch.

8. An integrated circuit memory, comprising:

a plurality of memory cell arrays arranged in a grid pattern, adjacent ones of the memory cell arrays being laterally separated, thereby defining longitudinal streets, and adjacent ones of the memory arrays being longitudinally separated, thereby defining latitudinal streets;

gap regions including a first gap region, each defined by an intersection of the longitudinal and latitudinal streets;

first and second row decoders located in the latitudinal streets and separated by the first gap region; and a decoder control circuit located in the first gap region and coupled to provide an address signal to the first and second decoders, the decoder control circuit including a driver selected from the group consisting of an inverter and a latch.

9. An integrated circuit memory, comprising:

first and second decoders, each having X/2 inputs and together having X inputs;

a first gap region between the first and second decoders; and a decoder control circuit located in the first gap region and including X/2 drivers providing X/2 output signals to the X inputs of the first and second decoders.

10. The memory of claim 9, wherein each driver in the decoder control circuit provides an output signal to an input of the first decoder and to an input of the second decoder.

11. The memory of claim 9, wherein the driver includes an inverter.

12. The memory of claim 9, wherein the driver includes a latch.

13. The memory of claim 9, wherein the drivers are arranged in a staggered configuration, such that the X/2 staggered drivers are arranged in X/2 lateral rows.

14. The memory of claim 9, wherein the drivers are arranged in pairs, each driver in the pair laterally offset from the other driver in the pair, such that the X/2 staggered drivers are arranged in X/4 lateral rows.

15. An integrated circuit memory, comprising:

a plurality of memory cell arrays arranged in a grid pattern, adjacent ones of the memory cell arrays being laterally separated, thereby defining longitudinal streets, and adjacent ones of the memory arrays being longitudinally separated, thereby defining latitudinal streets;

a gap region, defined by an intersection of the longitudinal and latitudinal streets;

a pair of row decoders located in a latitudinal street, a first row decoder of the pair located on a first side of the gap region, and a second row decoder of the pair located on an opposite side of the gap region, and the first and second row decoders each having X/2 inputs and together having X inputs; and a decoder control circuit located in the first gap region and including X/2 drivers providing X/2 output signals to the X inputs of the first and second row decoders, wherein each driver provides an output signal to an input of the first row decoder and to an input of the second row decoder, and each driver is selected from the group consisting of an inverter and a latch.

16. The memory of claim 15, wherein the drivers are arranged in a staggered configuration, such that the X/2 staggered drivers are arranged in X/2 lateral rows.

17. The memory of claim 15, wherein the drivers are arranged in pairs, each driver in the pair laterally offset from the other driver in the pair, such that the X/2 staggered drivers are arranged in X/4 lateral rows.

18. An integrated circuit memory, comprising:

a plurality of row decoders; and a plurality of drivers, each driver coupled to more than one row decoder for providing an address signal to the more than one row decoder, each driver interposed between a pair of the row decoders.

19. An integrated circuit memory, comprising:

a plurality of memory cell arrays, arranged in a matrix with longitudinal and latitudinal streets bounding the memory cell arrays;

a plurality of row decoders, placed in the latitudinal streets and defining a magnitude thereof, each row decoder coupled to at least one of the memory cell arrays by a plurality of word lines, each row decoder including X/2 inputs such that each pair of row decoders includes X inputs;

a plurality of sense amplifiers, placed in the longitudinal streets, each sense amplifier coupled to at least one of the memory cell arrays by at least one digit line;

a plurality of column decoders, placed in the longitudinal streets and, together with the sense amplifiers, defining a magnitude thereof, each column decoder coupled to at least one of the memory cell arrays by a plurality of digit lines; and a plurality of decoder control circuits, each decoder control circuit placed in an intersection of one of the longitudinal streets and one of the latitudinal streets, and carrying a plurality of drivers, ones of the drivers coupled to more than one row decoder for providing an address signal to the more than one row decoder, such that the decoder control circuit provides X/2 output signals to the X inputs of a pair of row decoders.

20. An integrated circuit memory, comprising:

first and second decoders separated by a first gap region; and means for performing the function of controlling and addressing both of the first and second decoders, said means being located in the first gap region between the first and second decoders.

* * * * *

UNITED STATES PATENT AND TRADEMARK OFFICE
CERTIFICATE OF CORRECTION

| | |
|---|---|
| PATENT NO. | : 6,038,159 |
| APPLICATION NO. | : 09/252369 |
| DATED | : March 14, 2000 |
| INVENTOR(S) | : George B. Raad |

It is certified that error appears in the above-identified patent and that said Letters Patent is hereby corrected as shown below:

In column 7, line 7, delete "claim 1" and insert therefor --claim 2--.

In column 7, line 11, delete "claim 1" and insert therefor --claim 4--.

Signed and Sealed this

Second Day of October, 2007

JON W. DUDAS
*Director of the United States Patent and Trademark Office*